United States Patent
McIntyre

(10) Patent No.: US 7,710,137 B2
(45) Date of Patent: May 4, 2010

(54) METHOD AND APPARATUS FOR RELATIVE TESTING OF INTEGRATED CIRCUIT DEVICES

(75) Inventor: Michael G. McIntyre, Austin, TX (US)

(73) Assignee: Globalfoundries Inc., Grand Cayman (KY)

( * ) Notice: Subject to any disclaimer, the term of this patent is extended or adjusted under 35 U.S.C. 154(b) by 0 days.

(21) Appl. No.: 11/849,702

(22) Filed: Sep. 4, 2007

(65) Prior Publication Data

US 2009/0058444 A1 Mar. 5, 2009

(51) Int. Cl.
*G01R 31/02* (2006.01)
(52) U.S. Cl. .................................... 324/763
(58) Field of Classification Search .................. 324/763
See application file for complete search history.

(56) References Cited

U.S. PATENT DOCUMENTS

| 6,512,985 B1* | 1/2003 | Whitefield et al. ............ 702/81 |
| 7,047,463 B1* | 5/2006 | Organ et al. ................ 714/724 |
| 2004/0004493 A1* | 1/2004 | Furukawa ................... 324/765 |
| 2005/0057272 A1* | 3/2005 | Park et al. .................... 324/765 |
| 2006/0184264 A1* | 8/2006 | Willis et al. ................. 700/108 |
| 2006/0267577 A1* | 11/2006 | Erez et al. ................ 324/158.1 |

* cited by examiner

*Primary Examiner*—Ha Tran T Nguyen
*Assistant Examiner*—Shaun Campbell
(74) *Attorney, Agent, or Firm*—Williams, Morgan & Amerson, P.C.

(57) ABSTRACT

A method includes loading a plurality of integrated circuit devices into a tester. At least one parameter is determined for each of the integrated circuit devices using the tester. At least one relative acceptance criterion associated with the parameter is determined based on the determined parameters for the plurality of integrated circuit devices. A pass/fail status of each of the integrated circuit devices is determined using the relative acceptance criterion.

21 Claims, 4 Drawing Sheets

METHOD AND APPARATUS FOR RELATIVE TESTING OF INTEGRATED CIRCUIT DEVICES

CROSS-REFERENCE TO RELATED APPLICATIONS

Not applicable.

BACKGROUND OF THE INVENTION

The disclosed subject matter relates generally to manufacturing and, more particularly, to a method and apparatus for dynamically determining tester recipes.

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a wafer using a variety of processing tools, including photolithography steppers, etch tools, deposition tools, polishing tools, rapid thermal processing tools, implantation tools, etc. During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device.

After fabrication of the devices is complete, each wafer is subjected to preliminary functional tests, commonly referred to as final wafer electrical tests (FWET) that evaluate test structures on the wafer and SORT tests that evaluate each die. Wafers that pass these tests are then cut to singulate the individual die, which are then packed in substrates. Packed die are then subjected to additional tests against the specification of customers' orders to determine performance characteristics such as maximum operating speed, power, caches, etc.

Exemplary tests include initial class tests (ICL) that are preliminary tests for power and speed. ICL testing is usually followed by burn-in (BI) and post burn-in (PBI) tests that test packaged die under specified temperature and/or voltage stress, and automatic test equipment (ATE) tests that test die functionality. Then, packaged die with different characteristics go through system-level tests (SLT) in which they are tested against customer requirements on specific electrical characteristics. In SLT, packaged die are tested in an actual motherboard by running system-level tests (e.g., variance test programs). After completion of the testing, the devices are fused, marked, and packed to fill customer orders. This back-end processing is commonly referred to as the test, mark, pack (TMP) process.

Typically, test instructions and acceptance criteria are defined for each test program implemented by a tester. These programs are typically stored in a central database and essentially static. A tester may periodically download the most current "golden" test program from a central data store prior to implementing the test. The recipe database allows revision and configuration control. However, the test program is executed without change once it is downloaded by the tester. Hence, the test flow and acceptance criteria employed by the tester are static.

Device testing is often an iterative process that involves testing the device using various frequency and voltage ranges to attempt to accurately determine the maximum frequency and minimum voltage capabilities of the device. The length of the test program and the resulting throughput of the tester is thus directly proportional to the number of test iterations required. Hence, programs implemented for testing devices are typically lengthy and detailed. These test programs are typically written at the beginning of the device life cycle so that the new device may be thoroughly exercised and characterized. Generally, the test program does not change significantly once it is implemented. The length of time required to implement these tests is a throughput limiting factor in the production flow.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY OF THE INVENTION

The following presents a simplified summary of the disclosed subject matter in order to provide a basic understanding of some aspects thereof. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method for testing integrated circuit devices. The method includes loading a plurality of integrated circuit devices into a tester. At least one parameter is determined for each of the integrated circuit devices using the tester. At least one relative acceptance criterion associated with the parameter is determined based on the determined parameters for the plurality of integrated circuit devices. A pass/fail status of each of the integrated circuit devices is determined using the relative acceptance criterion.

Another aspect of the disclosed subject matter is seen in an integrated circuit tester including a plurality of sockets for receiving a plurality of integrated circuit devices and test circuitry. The test circuitry is operable to determine at least one parameter for each of the integrated circuit devices disposed in the sockets, determine at least one relative acceptance criterion associated with the parameter based on the determined parameters for the plurality of integrated circuit devices; and determine a pass/fail status of each of the integrated circuit devices using the relative acceptance criterion.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
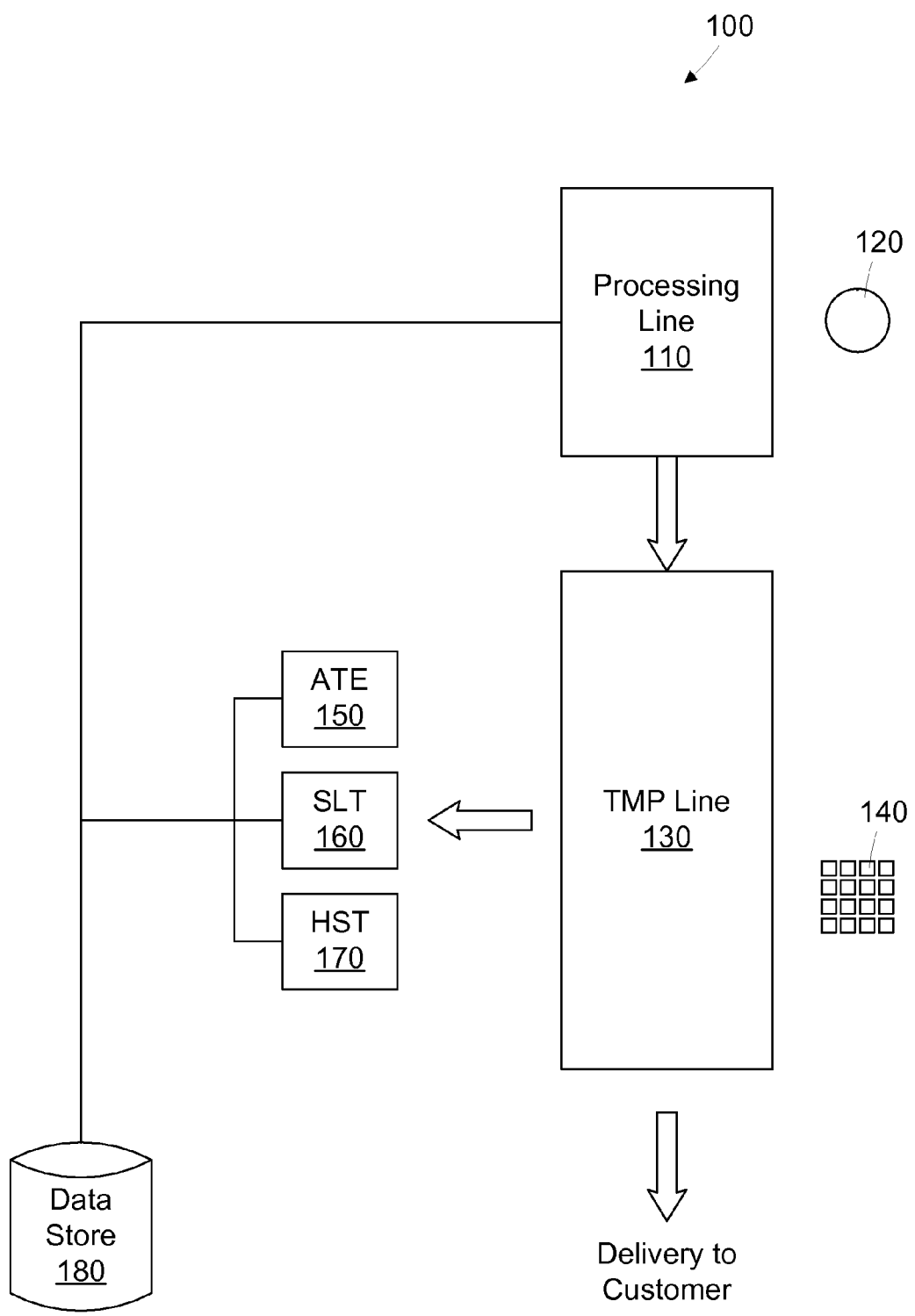
FIG. 1 is a simplified block diagram of a manufacturing system in accordance with one embodiment of the disclosed subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION OF THE INVENTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "accessing" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices. Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

Referring now to the drawings wherein like reference numbers correspond to similar components throughout the several views and, specifically, referring to FIG. 1, the disclosed subject matter shall be described in the context of an illustrative manufacturing system 100. The manufacturing system 100 includes a processing line 110 for fabricating wafers 120, a test, mark, pack (TMP) line 130 for processing devices 140, an automated test equipment (ATE) tester 150, a system lever tester (ST) 160, a hybrid system tester (HST) 170, and a data store 180.

In the illustrated embodiment, wafers 120 are processed by the processing line 110 to fabricate die thereon. The processing line 110 may include a variety of process tools and/or metrology tools, which may be used to process and/or examine the wafers to fabricate the semiconductor devices. For example, the process tools may include photolithography steppers, etch tools, deposition tools, polishing tools, rapid thermal anneal tools, ion implantation tools, and the like. The process metrology tools may include thickness measurement tools, scatterometers, ellipsometers, scanning electron microscopes, and the like. Techniques for processing the wafers 120 are well known to persons of ordinary skill in the art and therefore will not be discussed in detail herein for clarity and to avoid obscuring the disclosed subject matter. Although a single wafer 120 is pictured in FIG. 1, it is to be understood that the wafer 120 is representative of a single wafer as well as a group of wafers, e.g. all or a portion of a wafer lot that may be processed in the processing line 110.

After the wafers 120 have been processed in the processing line 110 to fabricate the die, certain metrology tools, such as sort or final wafer electrical test (FWET) tools may be employed to collect electrical performance data while the wafer is still uncut. Sort metrology employs a series of probes to electrically contact pads on the completed die to perform electrical and functional tests. For example, a sort metrology tool may measure voltages and/or currents between various nodes and circuits that are formed on the wafer 120. Exemplary sort parameters measured include, but are not limited to, clock search parameters, diode characteristics, scan logic voltage, static $I_{DD}$, minimum $V_{DD}$, power supply open short characteristics, and ring oscillator frequency, etc. The particular sort parameters selected may vary depending on the application and the nature of the device formed on the die. Final wafer electrical testing (FWET) entails parametric testing of discrete structures like transistors, capacitors, resistors, interconnects and relatively small and simple circuits, such as ring oscillators. It is intended to provide a quick indication as to whether or not the wafer is within basic manufacturing specification limits. Wafers that exceed these limits are typically discarded so as to not waste subsequent time or resources on them.

Based on FWET and sort data, the die may be assigned preliminary market segment designators or bin assignments. These classifications indicate the type of application the die is likely to be capable of serving. Exemplary market segments include server, mobile, and desktop. Generally, devices with low power requirements are better suited for mobile applications, while those with higher power requirements are better suited for server or desktop applications. Differentiations between servers and desktops may be made on the basis of maximum frequency and/or process conditions. For example, devices 140 which had some process faults during fabrication in the processing line 110 may be designated as being ineligible for server applications.

After the die on the wafer 120 have completed preliminary testing, the wafers 120 are cut to singulate the die. Each die is then each mounted to a package, resulting in the devices 140. The test units 150, 160, 170 then subject the devices 140 to various testing programs to grade the devices 140 and verify full functionality. Although only single testers 150, 160, 170 are illustrated, an actual implementation will involve multiple testers 150, 160, 170 of each type. In addition, a particular tester 150, 160, 170 may test multiple devices 140 in parallel.

Typically, ATE testers 150 are designed for high throughput, high accuracy testing. For example, an ATE tester 150 generally can run tests at different voltage levels with precise voltage control. The system level tester 160 is configured to test devices 140 in an actual system environment, such as by booting an operating system. System level testers 160 do not exhibit the speed characteristics or the voltage control characteristics of ATE testers 150. Hybrid system testers 170 are configured to perform burn-in tests and system level tests. The data store 180 houses information related to the testing of the devices 140 over the plurality of test program runs, or insertions.

In the illustrated example, an ATE tester 150 performs initial testing of the devices 140, referred to as ICL testing above. The ATE tester 150 does not employ a fixed test program for performing the test. One goal of ICL testing is to verify the FWET and sort results with respect to the bin assignment. Rather than using fixed acceptance criteria for the testing, the ATE tester 150 tests a plurality of devices 140 that are loaded into the tester 150 (i.e., in parallel or serially).

Figure 2:
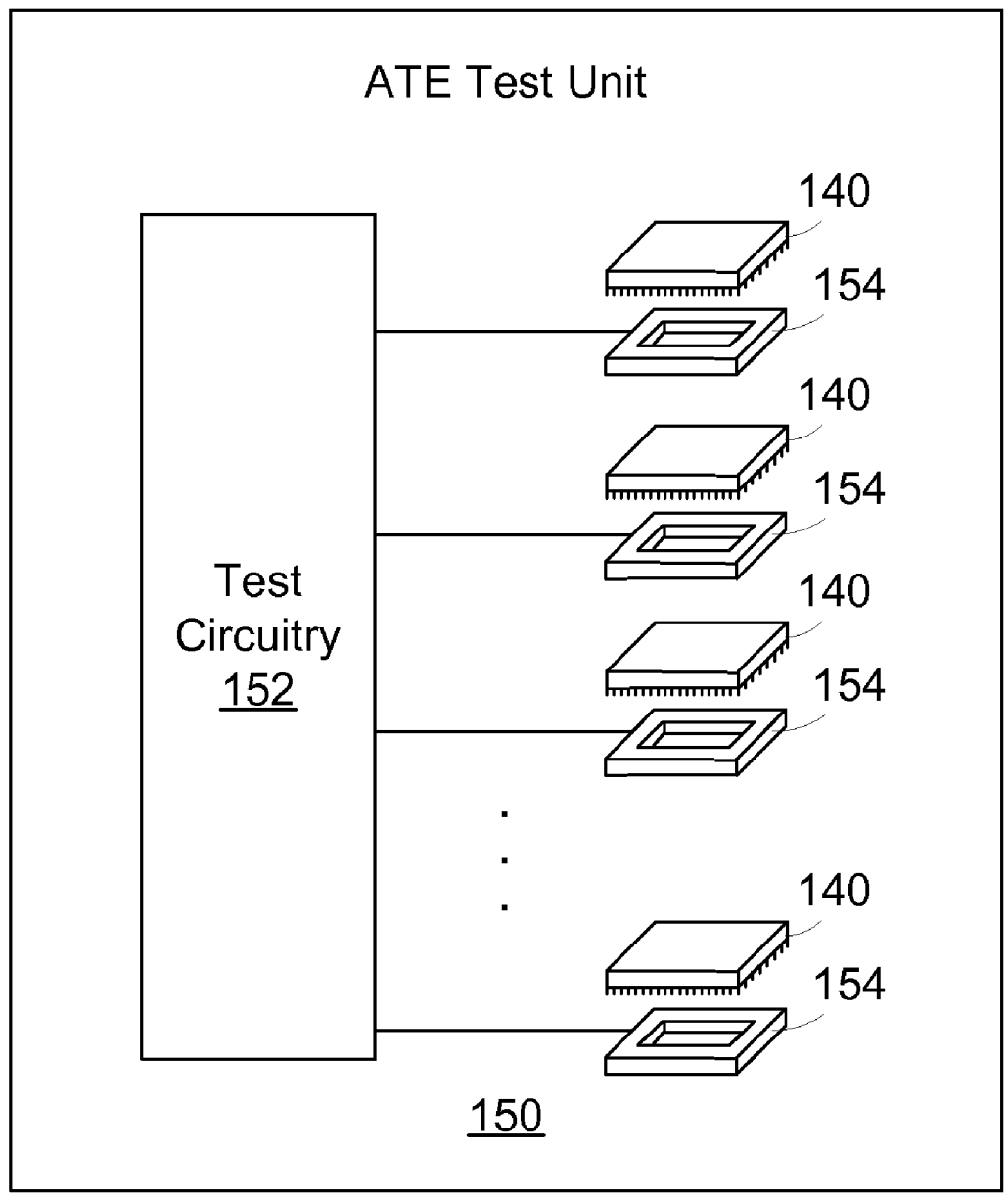
FIG. 2 is a simplified diagram of a tester in the system of FIG. 1.

Turning briefly to FIG. 2, a simplified diagram of the ATE tester 150 is shown. The ATE tester 150 includes test circuitry 152 and a plurality of sockets 154 for receiving devices under test 140. For ease of illustration and to avoid obscuring features of the embodiments of the subject matter, not all parts of the ATE tester 150 are depicted. For example, an automated material handler (e.g., robot arm) is typically employed to engage the devices under test 140 in the test sockets 154. The test circuitry 152 may be operable to test the devices 140 in parallel or sequentially.

Based on the test results from the group of devices 140, the ATE tester 150 generates relative acceptance criteria. Using the relative acceptance criteria, the ATE tester 150 may identify if the tested parameter or parameters of one or more of the plurality of devices 140 tested appreciably deviates from the parameters of the group. Employing the relative acceptance criteria allows the ATE tester 150 to readily screen the devices 140 under test. Drifts that occur over the product life cycle are less likely to impair the ability of the ATE tester 150 to identify outlier devices 140. In contrast, if fixed acceptance criteria were to be used, a drift could result in a significant number of devices under test 140 deviating from the acceptance criteria. Such errant failure designations could lead to the expenditure of additional testing resources to verify that the flagged devices are not defective.

There are various techniques for identifying devices that have characteristics different than the group of devices measured. In one embodiment, a simple average may be used. If a particular device has a characteristic value that differs from the average by an amount greater than a threshold (static or dynamic based on group statistics), that device may be flagged for closer evaluation. In some cases, if the parameters differ significantly, the device may be scrapped without expending further testing resources. In another embodiment, a statistical control limit may be generated based on the group results and a device that exceeds the control limit may be flagged as an outlier. Those of ordinary skill in the art are familiar with statistical techniques for determining such control limits to identify outlier members of a set.

Those devices that have parameters consistent with the group may be subjected to a reduced test program, while those identified as outliers may receive a more robust test program to more completely characterize their functionality and performance. Such a screening assumes that those devices 140 that have similar characteristics will likely perform similarly and have similar functional characteristics.

Using the screening methodology, the ATE tester 150 may implement a tiered approach to testing the devices 140. Full test regimens may not be performed on all members of a particular group. For example, screening parameters may be determined for the group. A full test program may be performed only on a sample of the group that has consistent screening parameters. Outliers may be subjected to a full test program or may be scrapped, depending on the magnitude of the deviation.

Various device parameters may be employed for screening purposes. Although the following illustration describes an ATE testing protocol, the technique described herein may also be applied to different testers, such as the system level tester 160 or the hybrid system tester 170. Accordingly, different test parameters and hierarchies may be employed.

Figure 3:
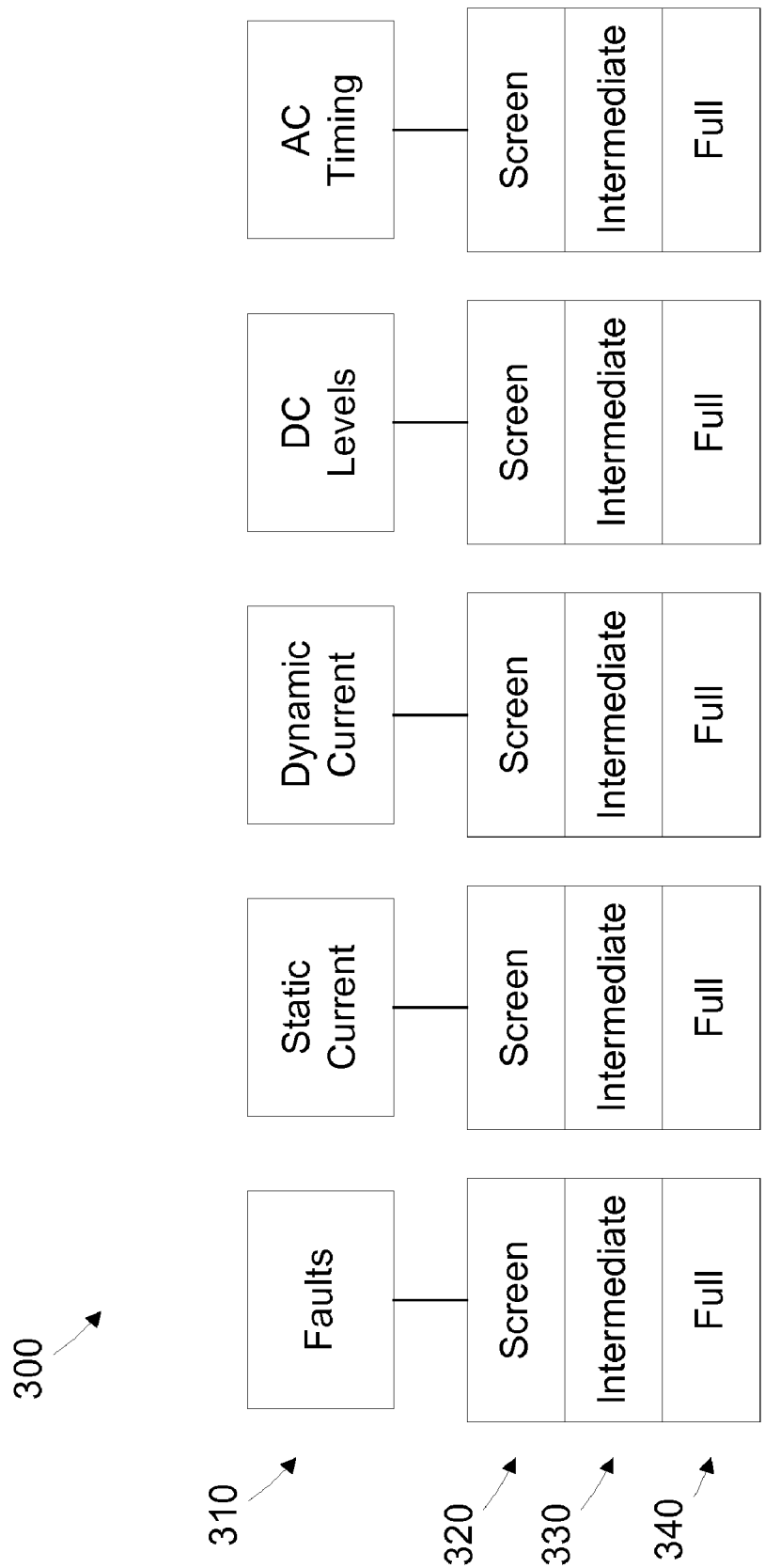
FIG. 3 is a simplified diagram of a test hierarchy used by the tester of FIG. 2.

Referring now to FIG. 3, in implementing the relative performance screening approach, a parameter hierarchy 300 may be employed. In the illustrated embodiment, the hierarchy includes categories 310 for Faults (e.g., open shorts or power supply shorts), Static Current (static $I_{DD}$), Dynamic Current (dynamic $I_{DD}$), DC levels (min $V_{DD}$), AC Timing, etc. The particular number of categories used may vary depending on the nature of the devices 140, and the selection illustrated in FIG. 3 is intended to be illustrative rather than limiting or exhaustive. Within each category 310, different test levels 320, 330, 340 may be defined. For example, the level 320 may be a screening level, the level 330 may be an intermediate level, and the level 340 may represent a detailed test level (i.e., full test). The ATE tester 150 may perform screening tests for one or more of the parameters and generate relative acceptance criteria for each category.

The particular types of tests performed and the segregation into levels may vary. Those of ordinary skill in the art are familiar with the various test protocols and techniques for separating the tests into different levels. As a typical test program may specify hundreds of different tests, the specific breakdowns of the levels are not detailed herein for simplicity and to avoid obscuring present subject matter.

In one embodiment, a multivariate model, such as a principal component analysis (PCA) model may be used to identify the parameter or parameters that most greatly affect the accuracy of the tester characterization. Other types of multivariate statistics-based analysis techniques that consider a plurality of parameters may be used. For example, one alternative modeling technique includes a k-Nearest Neighbor (KNN) technique. Based on the model, different screening levels may be selected. For example, if static current is determined to be an important parameter, relative to the other categories 310, a more detailed test level 340 may be specified. Similarly, for those categories 310 that are relatively less important contributors, a screening test with relative acceptance criteria may be selected.

If a group of devices 140 passes the screening level test 320 based on the relative acceptance criteria, the ATE tester 150 may skip the more detailed levels 330, 340 for those devices. If a particular device deviates from the group, the next level 330 may be executed to better characterize the particular device 140. It is likely that the devices 140 passing the screening test 310 will have similar characteristics. In other words, the devices 140 is likely to be placed in the same performance bin, and the preliminary binning conducted using FWET and sort data (i.e., market segment assignment) is likely to be accurate. If the devices 140 do not appear to be in the "well characterized" group, additional testing is warranted to determine the proper bin designation.

Figure 4:
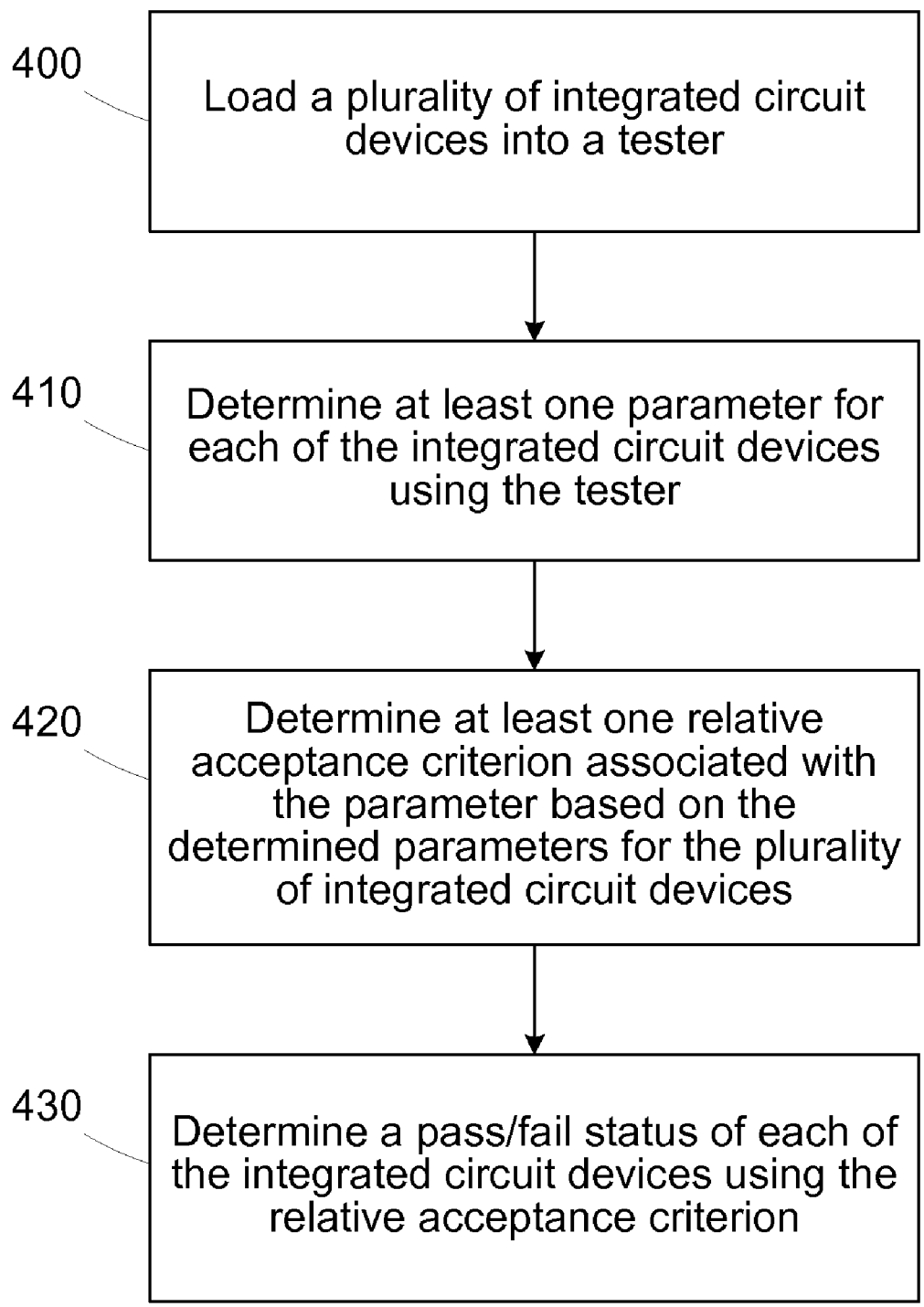
FIG. 4 is a flow diagram of a method for testing integrated circuit devices in accordance with another illustrative embodiment of the disclosed subject matter.

Turning now to FIG. 4, a simplified flow diagram for testing devices is provided. In method block 400, a plurality of integrated circuit devices are loaded into a tester. In method block 410, at least one parameter is determined for each of the integrated circuit devices using the tester. In method block 420, at least one relative acceptance criterion associated with the parameter is determined based on the determined parameters for the plurality of integrated circuit devices. In method block 430, a pass/fail status of each of the integrated circuit devices is determined using the relative acceptance criterion.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

I claim:

1. A method, comprising:
    determining at least one parameter for each of a plurality of integrated circuit devices loaded into a tester using the tester;
    determining at least one relative acceptance criterion associated with the parameter based on the determined parameters for the plurality of integrated circuit devices;
    determining a pass/fail status of each of the integrated circuit devices using the relative acceptance criterion;
    testing a first subset of the integrated circuit devices that pass the relative acceptance criterion using a first test program; and
    testing a second subset of the integrated circuit devices that pass the relative acceptance criterion using a second test program less detailed than the first program responsive to the integrated circuit devices in the first subset passing the testing using the first program.

2. The method of claim 1, further comprising testing the integrated circuit devices that fail to pass the relative acceptance criterion using a third test program, wherein the third test program specifies a higher degree of testing than the first test program.

3. The method of claim 1, further comprising scrapping at least one of the integrated circuit devices that fail to pass the relative acceptance criterion based on the relative acceptance criterion and the determined parameter of the at least one of the integrated circuit devices.

4. The method of claim 1, further comprising:
    determining a set of parameters for each of the integrated circuit devices;
    determining a relative acceptance criterion for each parameter in the set based on the sets of determined parameters for the plurality of integrated circuit devices; and
    determining a pass/fail status of each of the integrated circuit devices using the relative acceptance criteria defined for the set of parameters.

5. The method of claim 4, further comprising defining a test hierarchy for each parameter in the set, wherein the test hierarchy includes a plurality of levels varying in the degree of testing specified.

6. The method of claim 5 further comprising determining a required level in the test hierarchy for subsequent testing of the integrated circuit devices based on the pass/fail status.

7. The method of claim 1, further comprising determining the at least one parameter for each of the integrated circuit devices in parallel.

8. The method of claim 1, wherein the at least one parameter includes at least one of a fault parameter, a static current parameter, a dynamic current parameter, an operating voltage parameter, and or a timing parameter.

9. The method of claim 1, wherein determining the at least one relative acceptance criterion further comprises:
    determining an average value for the parameter; and
    determining the at least one relative acceptance criterion as an offset from the average.

10. The method of claim 9, further comprising excluding at least one outlier device in the plurality of integrated circuit devices from the average.

11. An integrated circuit tester, comprising:
    a plurality of sockets for receiving a plurality of integrated circuit devices;
    test circuitry operable to determine at least one parameter for each of the integrated circuit devices disposed in the sockets, determine at least one relative acceptance criterion associated with the parameter based on the determined parameters for the plurality of integrated circuit devices, determine a pass/fail status of each of the integrated circuit devices using the relative acceptance criterion, test a first subset of the integrated circuit devices that pass the relative acceptance criterion using a first test program, and test a second subset of the integrated circuit devices that pass the relative acceptance criterion using a second test program less detailed than the first program responsive to the integrated circuit devices in the first subset passing the testing using the first program.

12. The tester of claim 11, wherein the test circuitry is further operable to test the integrated circuit devices that fail to pass the relative acceptance criterion using a third test program, wherein the third test program specifies a higher degree of testing than the first test program.

13. The tester of claim 11, wherein the test circuitry is further operable to designate as scrap at least one of the integrated circuit devices that fail to pass the relative acceptance criterion based on the relative acceptance criterion and the determined parameter of the at least one of the integrated circuit devices.

14. The tester of claim 11, wherein the test circuitry is further operable to determine a set of parameters for each of the integrated circuit devices, determine a relative acceptance criterion for each parameter in the set based on the determined parameters for the plurality of integrated circuit devices, and determine a pass/fail status of each of the integrated circuit devices using the relative acceptance criteria defined for the set of parameters.

15. The tester of claim 14, wherein the test circuitry is further operable to employ a test hierarchy for each parameter in the set, wherein the test hierarchy includes a plurality of levels varying in the degree of testing specified.

16. The tester of claim 15, wherein the test circuitry is further operable to determine a required level in the test hierarchy for subsequent testing of the integrated circuit devices based on the pass/fail status.

17. The tester of claim 11, wherein the test circuitry is further operable to determine the at least one parameter for each of the integrated circuit devices in parallel.

18. The tester of claim 11, wherein the at least one parameter includes at least one of a fault parameter, a static current parameter, a dynamic current parameter, an operating voltage parameter, and or a timing parameter.

19. The tester of claim 11, wherein the test circuitry is further operable to determine an average value for the parameter and determine the at least one relative acceptance criterion as an offset from the average.

20. The tester of claim 19, wherein the test circuitry is further operable to exclude at least one outlier device in the plurality of integrated circuit devices from the average.

21. A tester comprising:
means for receiving a plurality of integrated circuit devices;
means for determining at least one parameter for each of the integrated circuit devices;
means for determining at least one relative acceptance criterion associated with the parameter based on the determined parameters for the plurality of integrated circuit devices;
means for determining a pass/fail status of each of the integrated circuit devices using the relative acceptance criterion;
means for testing a first subset of the integrated circuit devices that pass the relative acceptance criterion using a first test program; and
means for testing a second subset of the integrated circuit devices that pass the relative acceptance criterion using a second test program less detailed than the first program responsive to the integrated circuit devices in the first subset passing the testing using the first program.

* * * * *